United States Patent
Noda et al.

(10) Patent No.: US 7,091,093 B1
(45) Date of Patent: Aug. 15, 2006

(54) METHOD FOR FABRICATING A SEMICONDUCTOR DEVICE HAVING A POCKET DOPANT DIFFUSED LAYER

(75) Inventors: Taiji Noda, Osaka (JP); Hiroyuki Umimoto, Hyogo (JP); Shinji Odanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/662,358

(22) Filed: Sep. 15, 2000

(30) Foreign Application Priority Data

Sep. 17, 1999 (JP) ................................. 11-264124

(51) Int. Cl.
  *H01L 21/8236* (2006.01)
  *H01L 21/336* (2006.01)

(52) U.S. Cl. ................. 438/276; 438/291; 438/585

(58) Field of Classification Search ............... 438/197, 438/199, 217, 229–232, 276, 291, 585
See application file for complete search history.

(56) References Cited

U.S. PATENT DOCUMENTS

| | | | |
|---|---|---|---|
| 5,399,506 A * | 3/1995 | Tsukamoto | 438/301 |
| 5,650,340 A * | 7/1997 | Burr et al. | 438/286 |
| 5,786,620 A * | 7/1998 | Richards et al. | 257/408 |
| 5,923,987 A * | 7/1999 | Burr | 438/304 |
| 5,970,353 A * | 10/1999 | Sultan | 438/302 |
| 6,180,443 B1 * | 1/2001 | Kang et al. | 438/217 |
| 6,271,095 B1 * | 8/2001 | Yu | 438/303 |
| 6,319,798 B1 * | 11/2001 | Yu | 438/527 |
| 6,331,458 B1 * | 12/2001 | Anjum et al. | 438/197 |
| 6,333,217 B1 * | 12/2001 | Umimoto et al. | 438/301 |
| 6,391,731 B1 * | 5/2002 | Chong et al. | 438/303 |
| 6,432,802 B1 * | 8/2002 | Noda et al. | 438/585 |
| 6,500,739 B1 * | 12/2002 | Wang et al. | 438/514 |
| 6,548,361 B1 * | 4/2003 | En et al. | 438/301 |
| 6,720,632 B1 * | 4/2004 | Noda | 257/408 |

FOREIGN PATENT DOCUMENTS

| | | |
|---|---|---|
| JP | 3-272146 | 12/1991 |
| JP | 06-267974 | * 9/1994 |
| JP | 11-87706 | 3/1999 |

OTHER PUBLICATIONS

G.G. Shahidi et al., Indium Channel Implants for Improved MOSFET Behavior at the 100-nm Channel Length Regime. IEEE 1989, p. 2605.*
G.G. Shahidi et al., Indium Channel Implants for Improved Short-Channel Behavior of Submicrometer NMOSFET's. IEEE 1993, pp. 409-411.*
P. Bouillon et al., Theoritical Analysis of Kink Effect in C-V Characteristics of Indium-Implnated NMOS Capacitors. IEEE 1998, pp. 19-22.*
G.G. Shahidi et al., High-Performance Devices for a 0.15 micron CMOS Technology. IEEE 1993. pp. 466-468.*

* cited by examiner

*Primary Examiner*—Anh Duy Mai

(57) ABSTRACT

A gate electrode is formed over a semiconductor region with a gate insulating film interposed therebetween. An extended high-concentration dopant diffused layer of a first conductivity type is formed in part of the semiconductor region beside the gate electrode through diffusion of a first dopant. A pocket dopant diffused layer of a second conductivity type is formed under the extended high-concentration dopant diffused layer through diffusion of heavy ions. The pocket dopant diffused layer includes a segregated part that has been formed through segregation of the heavy ions.

9 Claims, 7 Drawing Sheets

METHOD FOR FABRICATING A SEMICONDUCTOR DEVICE HAVING A POCKET DOPANT DIFFUSED LAYER

BACKGROUND OF THE INVENTION

The present invention relates to a semiconductor device, which has a superfine structure contributing to ultralarge-scale integration of a semiconductor integrated circuit and can operate at a high speed with its power dissipation reduced, and also relates to a method for fabricating the same.

As ultralarge-scale integration of semiconductor integrated circuits advances, miniaturization of MIS transistors is demanded more and more strongly. For that purpose, an MIS transistor with a shallow junction is now in high demand.

FIG. 5 illustrates a cross-sectional structure for a known MIS transistor with a shallow junction. A gate electrode 3 has been formed over a p-type semiconductor substrate 1 with a gate insulating film 2 interposed therebetween. In respective surface regions of the semiconductor substrate 1 that are located on both sides of the gate electrode 3 (i.e., regions to be source/drain regions), high-concentration dopant diffused layer 5, extended high-concentration dopant diffused layer 6 and pocket dopant diffused layer 7 are formed. The high-concentration dopant diffused layer 5 is formed to have a deep junction by diffusing an n-type dopant (e.g., arsenic) thereto. The extended high-concentration dopant diffused layer 6 is formed inside the high-concentration dopant diffused layer 5 by diffusing an n-type dopant (e.g., arsenic) thereto and has a junction shallower than that of the high-concentration dopant diffused layer 5. And the pocket dopant diffused layer 7 is located under the extended high-concentration dopant diffused layer 6 and has been formed by diffusing a p-type dopant (e.g., boron) thereto. Also, a sidewall 8 has been formed out of an insulating film on the side faces of the gate electrode 3.

Hereinafter, a method for fabricating the known MIS transistor will be described with reference to FIGS. 6(a) through 6(e).

First, as shown in FIG. 6(a), a gate electrode 3 is formed over a p-type semiconductor substrate 1 with a gate insulating film 2 interposed therebetween.

Next, arsenic and boron ions are implanted in this order as n- and p-type dopant ions, respectively, using the gate electrode 3 as a mask, thereby forming n- and p-type-ion implanted layers 6A and 7A, respectively, as shown in FIG. 6(b).

Then, a silicon nitride film is deposited over the entire surface of the semiconductor substrate 1 at a temperature of about 700° C., and then etched anisotropically, thereby forming a sidewall 8 on the side faces of the gate electrode 3 as shown in FIG. 6(c).

Subsequently, arsenic ions are implanted as n-type dopant ions using the gate electrode 2 and sidewall 8 as a mask. Then, annealing is conducted at a temperature between about 900° C. and about 1000° C. for about 10 seconds. In this manner, n-type high-concentration dopant diffused layer 5 with a deep junction, n-type extended high-concentration dopant diffused layer 6 located inside the high-concentration dopant diffused layer 5 and having a junction shallower than that of the high-concentration dopant diffused layer 5 and p-type pocket dopant diffused layer 7 located under the extended high-concentration dopant diffused layer 6 are formed as shown in FIG. 6(d).

Thereafter, a cobalt film and a titanium nitride film are deposited in this order to thicknesses of about 10 nm and about 20 nm, respectively, over the semiconductor substrate 1 by a sputtering process. Next, annealing is conducted at a temperature of about 550° C. for about 10 seconds. Then, the titanium nitride film and unreacted parts of the cobalt film are selectively etched away using a mixture of sulfuric acid, hydrogen peroxide and water. And then annealing is conducted at a temperature of about 800° C. for about 10 seconds. In this manner, a cobalt silicide layer 9 is formed to a thickness of about 30 nm on respective surfaces of the gate electrode 3 and high-concentration dopant diffused layer 5 in a self-aligned manner as shown in FIG. 6(e).

In the known MIS transistor fabrication process, the implant energy of arsenic ions for the n-type-ion implanted layer 6A, which is provided to form the extended highconcentration dopant diffused layer 6, is lowered to make the junction of the extended high-concentration dopant diffused layer 6 shallower and thereby increase the driving power of the MIS transistor. Also, to reduce the parasitic resistance of the source/drain regions, the implant dose of the arsenic ions is normally increased in this case.

However, if the n-type-ion implanted layer 6A is formed by implanting the arsenic ions at a high implant dose and with a low implant energy, then transient enhanced diffusion (TED) of arsenic and boron (i.e., dopants for the n-type-ion implanted layer 6A and pocket dopant diffused layer 7) occurs during the lower-temperature (e.g., about 700° C.) annealing process to be carried out after that to form the sidewall 8. In that case, the extended high-concentration dopant diffused layer 6 and pocket dopant diffused layer 7 cannot be formed to have respective shallow junctions as designed. It should be noted that the transient enhanced diffusion is a phenomenon in which an introduced dopant unintentionally diffuses at such a rate as exceeding its diffusion coefficient in thermal equilibrium state. This is because point defects, existing in excessive numbers between lattice sites, and the dopant interact with each other to mutually enhance their diffusion.

FIG. 7 illustrates profiles of the dopant ions, which have been introduced to form the extended high-concentration dopant diffused layer 6 and pocket dopant diffused layer 7, in the depth direction (i.e., the direction indicated by the line A–A' in FIG. 5). As can be seen from FIG. 7, the profile of arsenic for the extended high-concentration dopant diffused layer 6 as plotted in the depth direction shows that its diffusion is rather deep due to the transient enhanced diffusion effects during the anneal. Boron for the pocket dopant diffused layer 7 has also been much affected by the transient enhanced diffusion so that its profile has lost sharpness. As also can be seen from FIG. 7, according to the known method, it is difficult to form the extended high-concentration dopant diffused layer and pocket dopant diffused layer just as intended, i.e., so that these layers have shallow and sharp dopant profiles and exhibit excellent short channel effects.

SUMMARY OF THE INVENTION

In view of the foregoing, an object of the present invention is providing a semiconductor device that can shallow the junction depths of extended high-concentration dopant diffused layer and pocket dopant diffused layer and can minimize increase in junction leakage current and a method for fabricating the device.

To achieve this object, an inventive semiconductor device includes: a gate electrode formed over a semiconductor region with a gate insulating film interposed therebetween; an extended high-concentration dopant diffused layer of a first conductivity type that has been formed in part of the semiconductor region beside the gate electrode through diffusion of a first dopant; and a pocket dopant diffused layer of a second conductivity type that has been formed under the extended high-concentration dopant diffused layer through diffusion of heavy ions. The pocket dopant diffused layer includes a segregated part that has been formed through segregation of the heavy ions.

In the inventive semiconductor device, the pocket dopant diffused layer is formed through diffusion of a dopant of a second conductivity type that has a large mass (e.g., indium). A dopant with a large mass shows a small diffusion coefficient in its thermal equilibrium state. In addition, most of point defects, which have been created in excessive numbers due to the damage involved with implantation, are trapped into a dislocation loop layer. That is to say, the number of freely movable, diffusible point defects decreases. As a result, the dopant profile of the pocket dopant diffused layer sharpens. Furthermore, the dislocation loop layer is formed inside the pocket dopant diffused layer and segregated parts are formed in the dislocation loop layer through segregation of the dopant with a large mass.

Accordingly, in the extended high-concentration dopant diffused layer located closer to the surface of the substrate than the pocket dopant diffused layer is, channeling of the first dopant of the first conductivity type is suppressed by an amorphous layer, which has been formed by the dopant of the second conductivity type that has the large mass. Moreover, diffusion of the first dopant is suppressed by the segregated parts of the pocket dopant diffused layer, and therefore the junction will be shallower. As a result, the driving power of the transistor can be increased and the short channel effects can be minimized, thus greatly contributing to miniaturization of the transistor.

An inventive method for fabricating a semiconductor device includes: a first step of forming a gate electrode over a semiconductor region with a gate insulating film interposed therebetween; a second step of implanting heavy ions into the semiconductor region using the gate electrode as a mask, thereby forming a first ion implanted layer, at least upper part of which is an amorphous layer; a third step of implanting ions of a first dopant into the semiconductor region, in which the amorphous layer has been formed, using the gate electrode as a mask, thereby forming a second ion implanted layer of a first conductivity type; and a fourth step of conducting a first annealing process to activate the first and second ion implanted layers, thereby forming an extended high-concentration dopant diffused layer of the first conductivity type through diffusion of the first dopant and a pocket dopant diffused layer, which is located under the extended high-concentration dopant diffused layer, through diffusion of the heavy ions, respectively. The pocket dopant diffused layer includes a segregated part that has been formed through segregation of the heavy ions.

According to the inventive method for fabricating a semiconductor device, after an amorphous layer has been formed in a semiconductor region by implanting heavy ions with a large mass thereto, ions of a first dopant of a first conductivity type are implanted. Thus, channeling of the first dopant is avoidable. Also, a dislocation loop layer is formed near an amorphous/crystalline interface during the annealing process after the ions have been implanted. And silicon interstitials, which usually cause transient enhanced diffusion, are trapped into the dislocation loop layer. Furthermore, a segregated part is formed in the pocket dopant diffused layer through segregation of the heavy ions. As a result, the diffusion of the first dopant of the first conductivity type is suppressed, and the extended high-concentration dopant layer can have a shallower junction.

According to the semiconductor device and its fabrication process of the present invention, heavy ions with a large mass number (e.g., indium) are used to form the pocket dopant diffused layer. Thus, pre-amorphization effects are attainable by the implantation of the heavy ions. And the dislocation loop layer can advantageously trap the silicon interstitials. In addition, since indium is easily trapped and segregated in the dislocation loop layer, the extended high-concentration dopant diffused layer and pocket dopant diffused layer can both have their junctions shallowed and sharpened. Accordingly, a miniaturized semiconductor device and a fabrication process thereof can be provided with the inverse channel effects suppressed.

Furthermore, in the inventive method for fabricating a semiconductor device, indium ions are implanted at a low energy and at a high dose to form the pocket dopant diffused layer. In this manner, the profile of the pocket dopant diffused layer can be defined at an optimum level and the dislocation loop layer can be defined not to overlap with a depletion layer in source/drain regions. As a result, the leakage current can be reduced.

DESCRIPTION OF THE PREFERRED EMBODIMENTS

Hereinafter, an MIS transistor structure according to an embodiment of the present invention will be described with reference to FIG. 1(a).

Figure 1A:
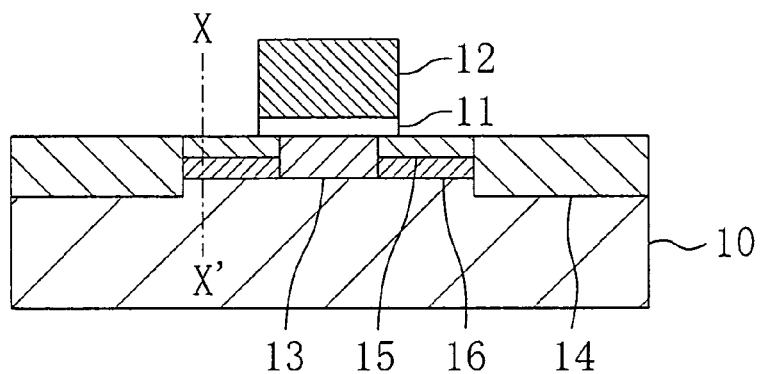
FIG. 1(a) is a cross-sectional view of an MIS transistor according to an embodiment of the present invention.

As shown in FIG. 1(a), a poly-metal or polysilicon gate electrode 12 is formed over a semiconductor substrate 10 of p-type silicon with a gate insulating film 11 of a silicon dioxide or silicon oxynitride film interposed therebetween. A p-type dopant diffused layer 13 to be a channel region is formed under the gate electrode 12 in a surface region of the semiconductor substrate 10 through diffusion of indium, for example.

In respective regions on both sides of the p-type dopant diffused layer 13 (i.e., regions to be source/drain regions), high-concentration dopant diffused layer 14, n-type extended high-concentration dopant diffused layer 15 and pocket dopant diffused layer 16 have been formed. The high-concentration dopant diffused layer 14 is formed to have a deep junction by diffusing an n-type dopant (e.g., arsenic) thereto. The n-type extended high-concentration dopant diffused layer 15 is formed inside the high-concentration dopant diffused layer 14 by diffusing an n-type dopant (e.g., arsenic) thereto and has a junction shallower than that of the high-concentration dopant diffused layer 14. And the pocket dopant diffused layer 16 is formed under the extended high-concentration dopant diffused layer 15 by diffusing a p-type dopant with a large mass (e.g., indium) thereto. As will be described later, the pocket dopant diffused layer 16 has segregated parts, by which the following effects are attainable.

Pocket Dopant Diffused Layer with Shallow Junction

Figure 1B:
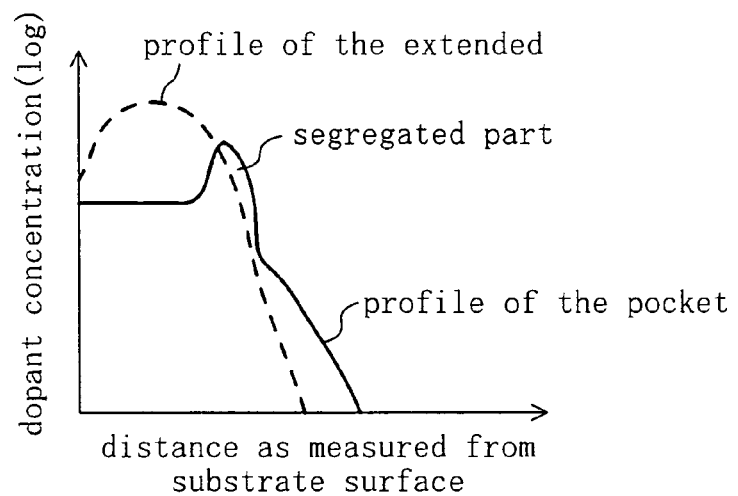
FIG. 1(b) is a graph illustrating a relationship between the distance as measured from the surface of the substrate in the depth direction along the line X–X' shown in FIG. 1(a) and the dopant concentrations.

FIG. 1(*b*) illustrates a relationship between the distance as measured from the surface of the substrate in the depth direction along the line X–X' shown in FIG. 1(*a*) and the dopant concentrations. As can be seen from FIG. 1(*b*), the pocket dopant diffused layer 16 has a segregated part that has been formed through segregation of a p-type dopant with a large mass (e.g., indium). This segregated part is formed as a result of segregation of indium ions in an End-of-Range dislocation loop layer, which has been created inside the pocket dopant diffused layer 16 during the implantation of the indium ions. For that reason, the pocket dopant diffused layer 16 comes to have a sharp dopant concentration profile that does not expand vertically deeper into the substrate. As a result, the junction thereof can be shallower.

The pocket high-concentration dopant diffused layer 16 is formed through diffusion of ions of a dopant with a large mass such as indium (i.e., heavy ions). Also, the dopant with the large mass shows a small diffusion coefficient in its thermal equilibrium state. In addition, silicon interstitials, which usually cause the transient enhanced diffusion, are trapped in the dislocation loop layer, and the number of silicon interstitials decreases. As a result, the transient enhanced diffusion of the indium ions is much less likely to occur, and therefore, the junction of the pocket dopant diffused layer can be shallower.

Furthermore, since the dopant diffusion itself is suppressed, the lateral dopant diffusion under the channel region is also minimized. Accordingly, the reverse channel characteristic of the transistor is suppressible, too.

Extended High-Concentration Dopant Layer with Shallow Junction

The above-described pocket dopant layer 16 is formed, i.e., ions of a dopant with a large mass such as indium (i.e., heavy ions) are implanted. Accordingly, the surface region of the ion implanted layer is amorphized. For that reason, in a subsequent process step in which arsenic ions are implanted to form the extended high-concentration dopant diffused layer 15, channeling of the arsenic ions can be suppressed.

In addition, silicon interstitials, which are created during the ion implantation and usually cause the transient enhanced diffusion, are trapped in the dislocation loop layer. As a result, the transient enhanced diffusion of the arsenic ions is suppressible, and therefore, the junction of the extended high-concentration dopant diffused layer 15 can also be shallower.

In this manner, by forming and utilizing the segregated parts in the pocket dopant diffused layer 16, the MIS transistor according to this embodiment can include the pocket dopant diffused layer 16 with a shallow junction and the extended high-concentration dopant diffused layer 15 with a shallow junction.

In the foregoing embodiment, indium ions are implanted as exemplary dopant ions for the dopant diffused layer 13 to be a channel region. Alternatively, either boron ions or boron and indium ions may be used instead.

Also, the foregoing embodiment is an n-channel MIS transistor. Alternatively, a p-channel MIS transistor is also implementable. As for a p-channel MIS transistor, ions of a dopant with a large mass to be implanted for the pocket dopant diffused layer 16 may be either antimony ions or ions of a Group 3B element with a mass number greater than that of antimony.

Hereinafter, a method for fabricating the MIS transistor according to an embodiment of the present invention will be described with reference to FIGS. 2(*a*) through 2(*c*) and FIGS. 3(*a*) and 3(*b*).

Figure 2A:
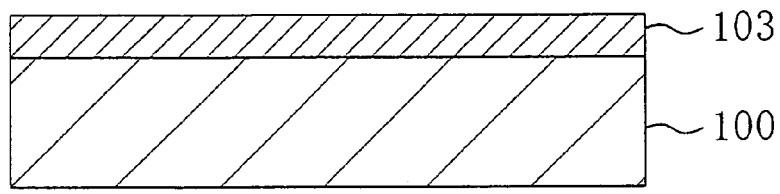
FIGS. 2(a) through 2(c) are cross-sectional views illustrating respective process steps of a method for fabricating an MIS transistor according to an embodiment of the present invention.
Figure 2B:
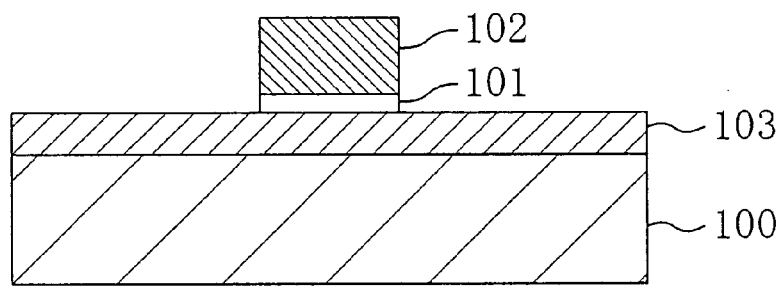

First, as shown in FIG. 2(*a*), ions of a p-type dopant (e.g., indium ions) are implanted into a semiconductor substrate 100 of p-type silicon at an implant energy of 200 keV and at an implant dose of about $1\times10^{12}/cm^2$, thereby forming a p-type-ion implanted layer. After this ion implantation process has been carried out, a first annealing process (i.e., rapid thermal annealing (RTA)) is conducted. Specifically, the semiconductor substrate 100 is heated up to an elevated temperature between 950° C. and 1050° C. at a rate of 100° C. per second and then kept at the temperature for a short period of time between about 1 second and about 10 seconds. In this manner, a p-type dopant diffused layer 103, which will be a channel region, is formed in a surface region of the semiconductor substrate 100.

Next, as shown in FIG. 2(*b*), a gate electrode 102 (thickness: about 250 nm) of polysilicon film or poly-metal is formed over the semiconductor substrate 100 with a gate insulating film 101 (thickness: about 2.5 nm) interposed therebetween.

Figure 2C:
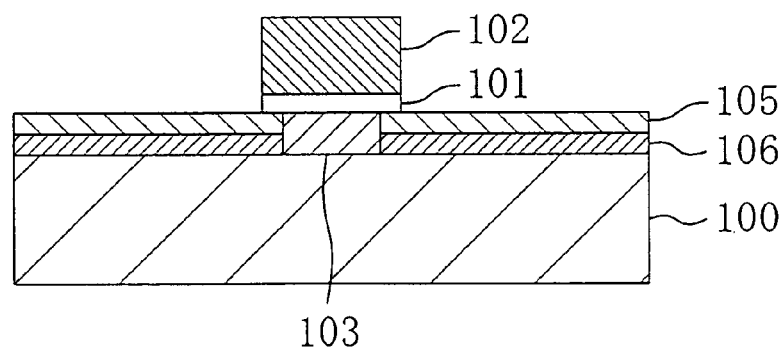

Subsequently, ions of a p-type dopant with a large mass (e.g., indium ions) are implanted into the semiconductor substrate 100 at an implant energy of 15 keV and at an implant dose of about $1\times10^{14}/cm^2$, for example, using the gate electrode 102 as a mask. The indium ions are implanted to form a pocket dopant diffused layer 16. However, when the indium ions are implanted, a first ion implanted layer, including an amorphous layer in the upper region of the semiconductor substrate 100, is formed. Thereafter, ions of an n-type dopant (e.g., arsenic ions) are implanted into the semiconductor substrate 100 at an implant energy of 10 keV and at an implant dose of about $5\times10^{14}/cm^2$, for example, using the gate electrode 102 as a mask, thereby forming a second ion implanted layer as a prototype of an extended high-concentration dopant diffused layer 15. Subsequently, a second annealing process (i.e., RTA) is conducted. Specifically, the substrate 100 is heated up to an elevated temperature between 950° C. and 1050° C. at a rate between 100° C. per second and 150° C. per second and then kept at the temperature for a short period of time between about 1 second and about 10 seconds. In this manner, as shown in FIG. 2(c), an n-type extended high-concentration dopant diffused layer 105 with a shallow junction is formed in respective regions of the semiconductor substrate 100 to be source/drain regions by diffusing the arsenic ions thereto. In addition, a p-type pocket dopant diffused layer 106 is also formed under the extended high-concentration dopant diffused layer 105 by diffusing the indium ions.

Figure 3A:
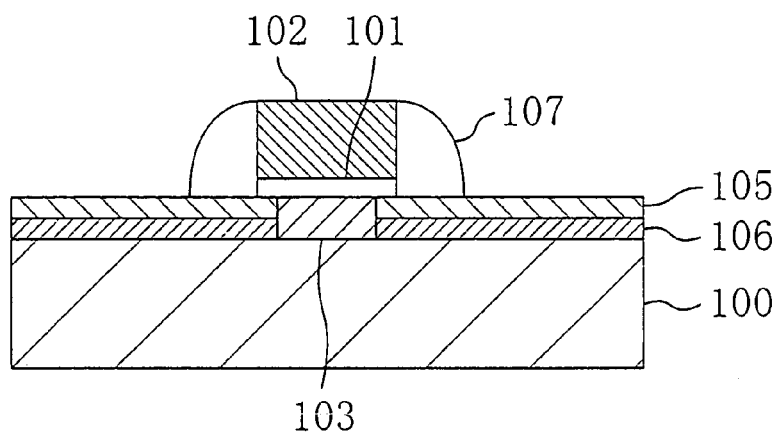
FIGS. 3(a) and 3(b) are cross-sectional views illustrating respective process steps of the method for fabricating the MIS transistor according to the embodiment of the present invention.

Then, a silicon nitride film is deposited to a thickness of 50 nm, for example, over the entire surface of the semiconductor substrate 100 and then etched anisotropically, thereby forming a sidewall 107 on the side faces of the gate electrode 102 as shown in FIG. 3(a). It should be noted that the sidewall 107 may be formed out of a silicon dioxide film, instead of the silicon nitride film.

Figure 3B:
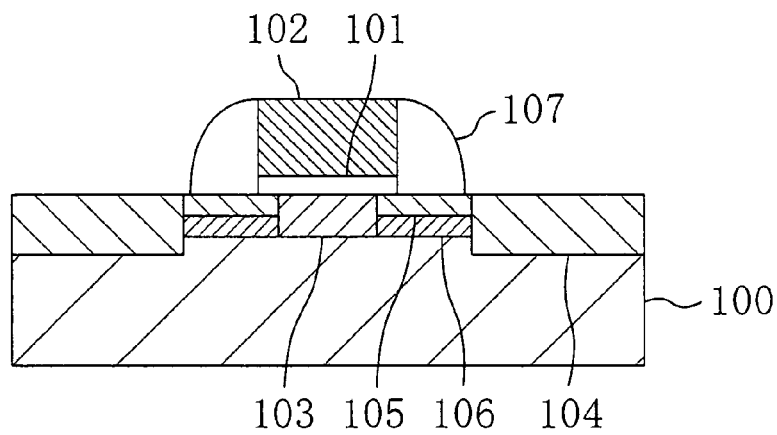

Next, ions of an n-type dopant (e.g., arsenic ions) are implanted into the semiconductor substrate 100 at an implant energy of 30 keV and at an implant dose of about $3\times10^{15}/cm^2$ using the gate electrode 102 and sidewall 107 as a mask, thereby forming an n-type-ion heavily implanted layer. Subsequently, a third annealing process (i.e., RTA) is conducted. Specifically, the substrate 100 is heated up to an elevated temperature between 950° C. and 1050° C. at a rate of 100° C. per second and then kept at the temperature for a short period of time between about 1 second and about 10 seconds. In this manner, an n-type high-concentration dopant diffused layer 104, which will be source/drain regions of the semiconductor substrate 100 and has a junction at a level deeper than that of the pocket dopant diffused layer 106, is formed as shown in FIG. 3(b).

Figure 4A:
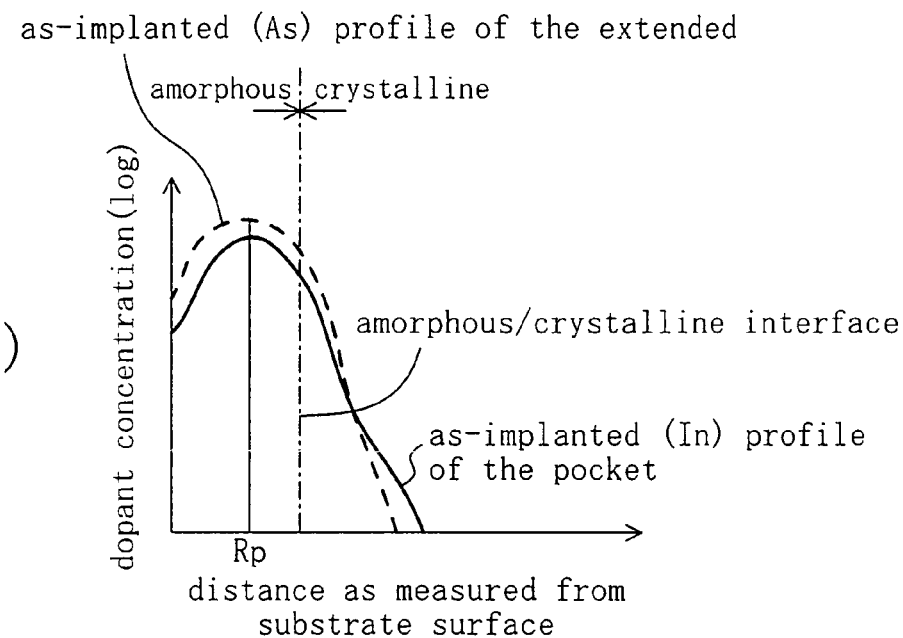
FIG. 4(a) is a graph illustrating a relationship between the distance as measured from the surface of the substrate and the dopant concentrations just after indium and arsenic ions have been implanted.
Figure 4B:
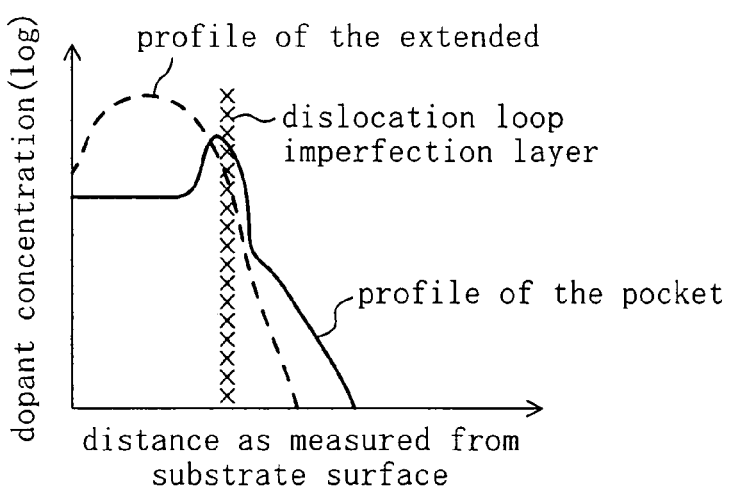
FIG. 4(b) is a graph illustrating a relationship between the distance as measured from the surface of the substrate and the dopant concentrations where annealing is performed after indium and arsenic ions have been implanted.
Figure 5:
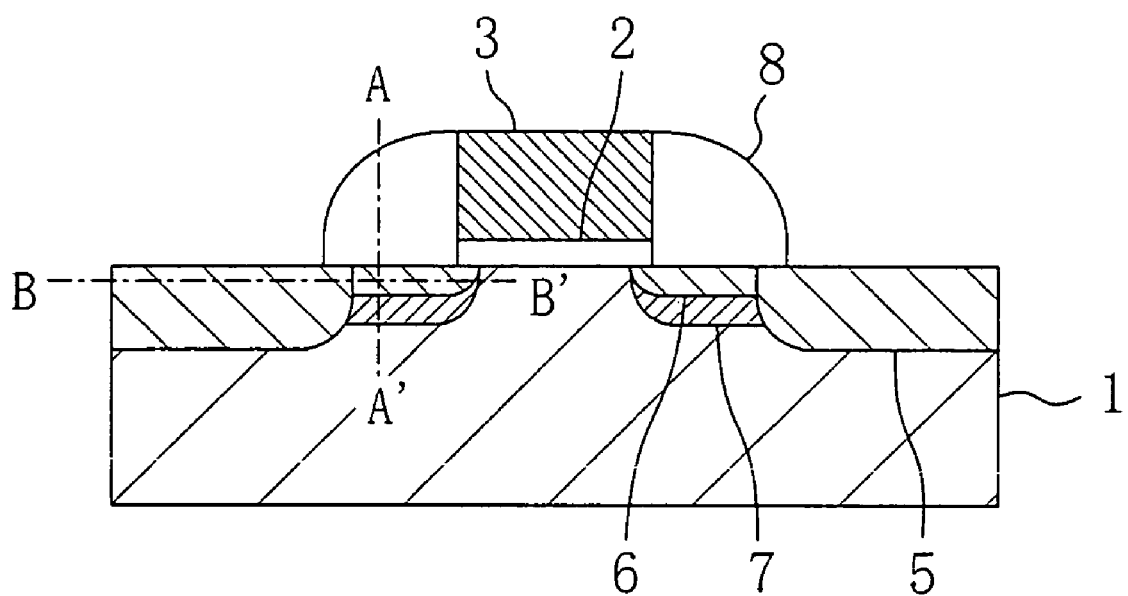
FIG. 5 is a cross-sectional view of a known MIS transistor.
Figure 6A:
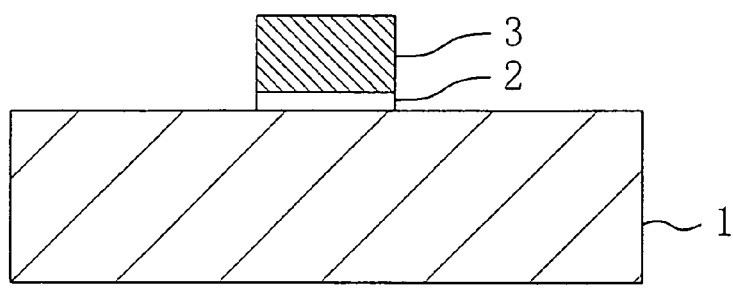
FIGS. 6(a) through 6(e) are cross-sectional views illustrating respective process steps of a method for fabricating the known MIS transistor.
Figure 6B:
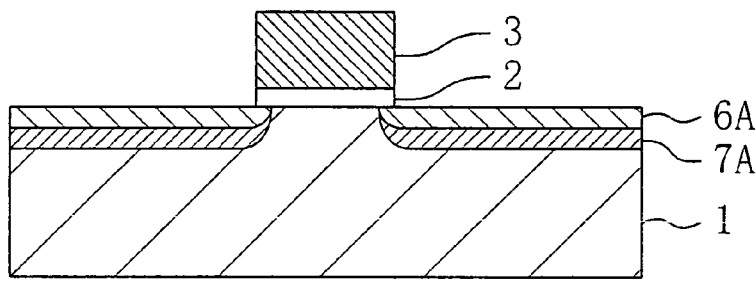
Figure 6C:
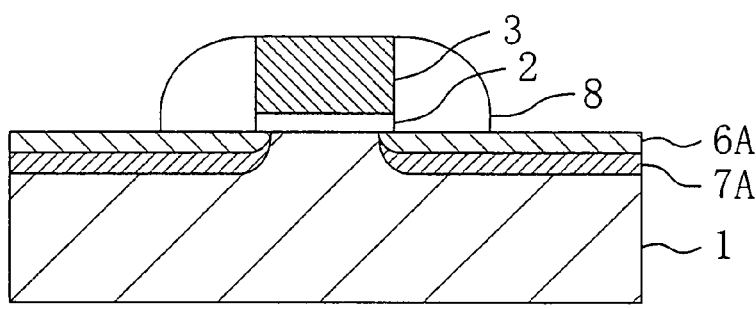
Figure 6D:
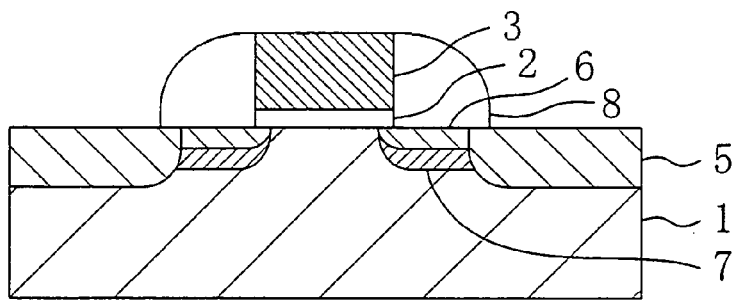
Figure 6E:
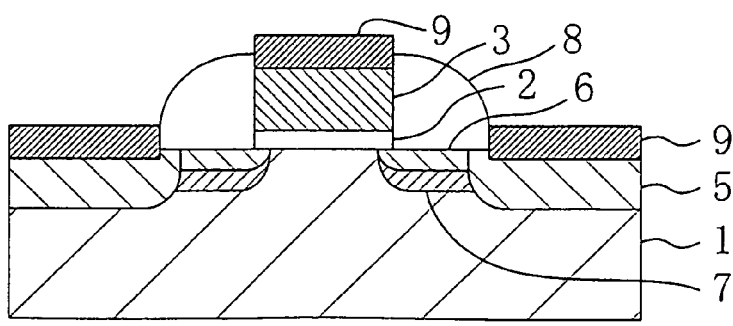
Figure 7:
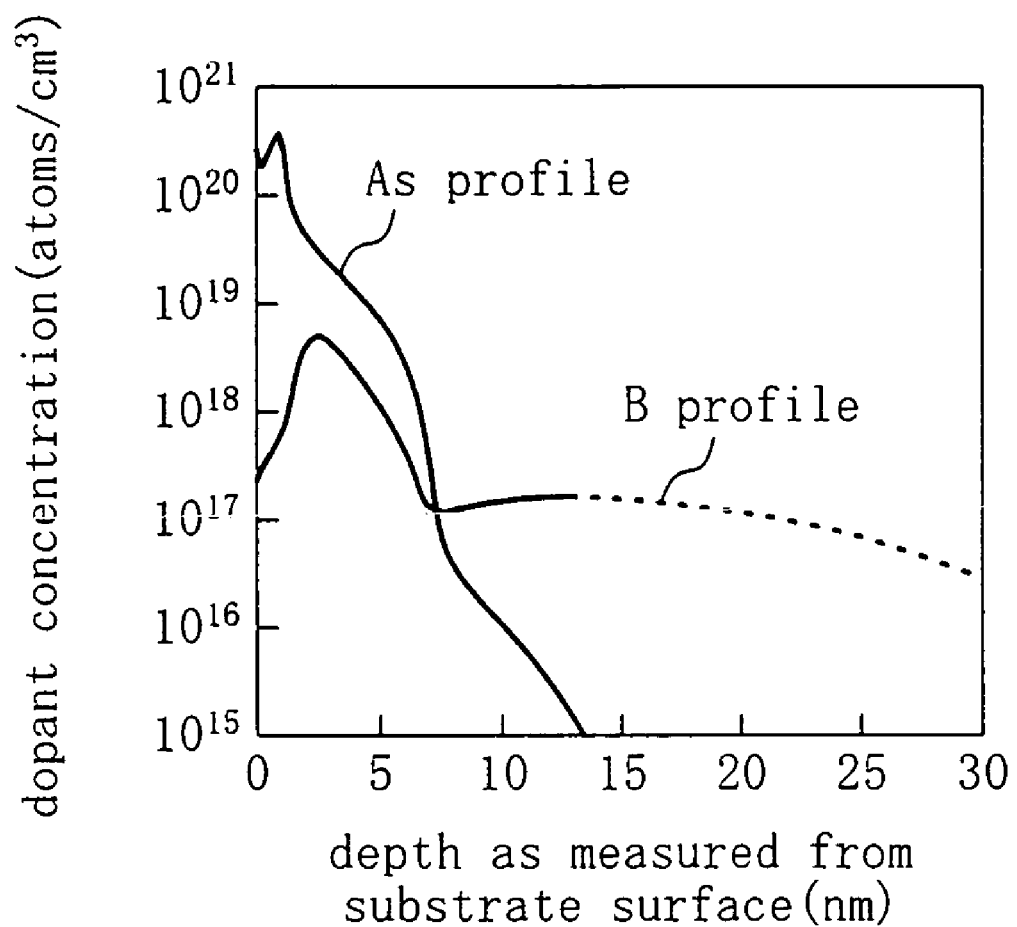
FIG. 7 is a graph illustrating a relationship between the depth as measured from the surface of the substrate and the dopant concentrations for the known MIS transistor.

FIG. 4(a) illustrates a relationship between the distance as measured from the substrate surface and the dopant concentrations just after indium and arsenic ions (i.e., ions for forming the pocket and extended high-concentration dopant diffused layers 106 and 105) have been implanted in the process step shown in FIG. 2(c). FIG. 4(b) illustrates a relationship between the distance as measured from the substrate surface and the dopant concentrations where the second annealing process is conducted after the indium and arsenic ions have been implanted.

In this embodiment, the indium ions are implanted at an implant dose of about $1\times10^{14}/cm^2$. Accordingly, an amorphous/crystalline interface is formed inside the semiconductor substrate 100 as shown in FIG. 4(a). As being affected by the mass of indium, the amorphous/crystalline interface is not formed in the vicinity of a peak of the concentration (i.e., the range Rp) of the indium implanted, but is located at a level deeper than the peak of concentration in the substrate. If the annealing process is conducted after this amorphous/crystalline interface has been formed, then the End-of-Range dislocation loop layer will be formed below the amorphous/crystalline interface (i.e., in the crystalline part). Accordingly, by activating the indium through the second annealing process, a segregated part will be created in the dislocation loop layer through segregation of indium. Thus, the dopant profile of the pocket dopant diffused layer 106 does not expand vertically deeper into the substrate but sharpens, and the pocket dopant diffused layer 106 has a shallower junction.

As described above, silicon interstitials, which usually cause the transient enhanced diffusion, are also trapped into the dislocation loop layer, thus suppressing the transient enhanced diffusion of the indium ions. Accordingly, the dopant profile of the pocket dopant diffused layer 106 sharpens and can have its junction defined at a shallower level.

Also, in the extended high-concentration dopant diffused layer 105 located closer to the surface of the substrate than the pocket high-concentration dopant layer 106 is, channeling of the arsenic ions is suppressed by the amorphous layer that has been formed by the indium ions implanted. Thus, an ion implanted layer with a shallower junction depth can be formed.

Furthermore, silicon interstitials, which usually cause the transient enhanced diffusion, are also trapped into the dislocation loop layer, thus suppressing the transient enhanced diffusion of the arsenic ions, too. Accordingly, the dopant profile of the extended high-concentration dopant diffused layer 105 sharpens and can have its junction defined at a shallower level.

As can be seen, according to this embodiment, even if the transistor is miniaturized, decrease in drain current can be suppressed and the driving power of the transistor can be increased.

In the foregoing embodiment, the indium ions are implanted at an implant dose of about $1\times10^{14}/cm^2$. However, if the ions are implanted at an implant dose of $5\times10^{13}/cm^2$ or more (preferably $1\times10^{16}/cm^2$ or less), then the amorphous layer can be formed inside the semiconductor substrate 100 and the segregated parts of indium can be formed in the pocket dopant diffused layer 106.

Also, in this embodiment, the indium and arsenic ions are implanted at implant energies of 15 keV and 10 keV for the pocket dopant diffused layer 106 and extended high-concentration dopant diffused layer 105, respectively. Accordingly, the range (Rp(In)) of the indium ions becomes almost equal to the range (Rp (As)) of the arsenic ions, and therefore, the ranges (Rp(In), Rp(As)) shown in FIG. 4(a) can be obtained. By adjusting the ranges of the indium and arsenic ions in this manner, the amorphous/crystalline interface can be located at a level deeper than the peak of concentration of the arsenic ions and yet is not located so far away from the extended high-concentration dopant layer 105. As described above, the amorphous/crystalline interface is formed by the indium ions implanted at a level deeper than the range (Rp(In)) of the indium ions. Accordingly, in forming the pocket dopant diffused layer 106, the implant energy of the indium ions should be determined in view of this result.

Normally the pocket dopant diffused layer 106 is formed under the extended high-concentration dopant diffused layer 105 and the range is adjusted to such a value as locating the peak of the concentration profile just under the extended high-concentration dopant layer 105. According to this embodiment, however, when the indium ions are implanted, the amorphous/crystalline interface is not formed in the vicinity of the range (Rp(In)) of the indium ions but is located at a deeper level. Thus, the range (Rp(In)) of the indium ions is set relatively shallow. The conditions of setting are as described above. As shown in FIG. 4(b), the segregated part of indium is formed on the crystalline part under the amorphous/crystalline interface. As a result, a pocket dopant diffused layer 106 with a shallow junction can be formed.

In this embodiment, the ranges of indium and arsenic are set approximately equal to each other (i.e., to Rp shown in FIG. 4(a)) as shown in FIG. 4(a). However, the relationship between the range (Rp(In)) of the indium ions implanted and the range (Rp(AS)) of the arsenic ions implanted may be given by $Rp(In) \leq Rp(As) \times 3.5$ That is to say, by setting Rp(In) 3.5 times or less as large as Rp(As), it is possible to prevent the segregated part of indium from being formed at a level far away from the profile of the extended high-concentration dopant diffused layer 105. As a result, the profile (i.e., the segregated part) of the pocket dopant diffused layer 106 can overlap with that of the extended high-concentration dopant layer 105 as shown in FIG. 4(b).

Also, if the implant energy of the indium ions to be introduced for the pocket dopant diffused layer 106 is adjusted so that the amorphous/crystalline interface will be deeper than the range of the arsenic ions to be introduced for the extended high-concentration dopant diffused layer 105 but shallower than the range of the arsenic ions to be introduced for the high-concentration dopant diffused layer 104 (that will be source/drain regions), then the dislocation loop layer will not be located in the depletion layer of the source or drain region. Thus, the junction leakage of the transistor can be reduced. If this dislocation loop layer is covered with the depletion layer, which is created in the source or drain region during the operation of the transistor, then a leakage current will flow between the source or drain region and the substrate due to the defects. In this embodiment, however, the defect layer is positioned so as not to overlap with the depletion layer. Thus, no junction leakage will occur.

If the implant energy of the indium ions to be introduced for the pocket dopant diffused layer 106 is set within a range from 5 to 30 keV, then the range of the indium ions will be located inside the extended high-concentration dopant diffused layer 105. Accordingly, the dislocation loop layer and the segregated part of indium can be formed inside the pocket dopant diffused layer 106.

Moreover, in this embodiment, the p-type dopant diffused layer 103 to be a channel region is formed by implanting ions of indium with a large mass into the p-type semiconductor substrate 100. Thus, the dopant concentration is low in the uppermost part of the channel region that is closest to the surface of the substrate. Accordingly, even if the transistor is downsized, the carrier mobility will not decrease and a sharp dopant concentration can be obtained in part of the channel region that is slightly deeper than the surface of the substrate. As a result, the transistor can be miniaturized without decreasing the driving power thereof.

Furthermore, the annealing process (RTA) is conducted immediately after the ions of indium with a large mass have been implanted to form the channel region. Thus, the damage done on the crystals of the semiconductor substrate 100 as a result of the implantation of the indium ions can be healed.

Also, in this embodiment, after the indium and arsenic ions have been implanted in this order at respectively appropriate implant energies, rapid thermal annealing is conducted as the second annealing process, thereby forming the extended high-concentration dopant diffused layer 105 and pocket dopant diffused layer 106. Accordingly, the silicon interstitials, which remain in excessive numbers in the crystalline layer, are trapped into the dislocation loop layer that is formed near the amorphous/crystalline interface. For that reason, the number of excessive silicon interstitials, which usually promote the transient enhanced diffusion of dopant ions, can be reduced. As a result, the transient enhanced diffusion can be suppressed while the extended highconcentration dopant diffused layer 105 and pocket dopant diffused layer 106 are being formed. And these layers can have shallower junctions.

In this embodiment, by using indium with a large mass number for the ion implantation process carried out to form the pocket dopant diffused layer 106, the pre-amorphization effects are attainable as described above. In addition, the silicon interstitials will be automatically trapped into the dislocation loop layer. Furthermore, since indium also tends to be trapped and strongly segregated in the dislocation loop layer, significant diffusion toward the low concentration part of the pocket dopant diffused layer 106 (i.e., a tail part of the dopant profile) is suppressible. Thus, the pocket dopant diffused layer 106 can have a shallow and steeper profile. Moreover, once such a sharp profile is obtained by suppressing the excessive diffusion of the pocket dopant diffused layer 106, the diffusion of indium toward the channel can also be minimized. As a result, the reverse channel effects are avoidable.

In the method for fabricating a semiconductor device according to this embodiment, both the extended high-concentration dopant layer 105 and pocket dopant diffused layer 106 can be shallowed and sharpened. Accordingly, it is possible to avoid a situation where only the pocket dopant diffused layer 106 of indium gets shallowed, sharpened and buried in the extended high-concentration dopant diffused layer 105.

In the foregoing embodiment, indium ions are implanted for the dopant diffused layer 103 to be a channel region. Alternatively, either boron ions or boron and indium ions may be implanted instead.

Also, the second annealing process (i.e., the process step shown in FIG. 2(c)) may be omitted. In that case, by conducting the third annealing process (i.e., the process step shown in FIG. 3(b)), the n-type extended high-concentration dopant diffused layer 105, p-type pocket dopant diffused layer 106 and high-concentration dopant diffused layer 104 can be formed at a time.

Furthermore, the foregoing embodiment is an n-channel MIS transistor. Alternatively, a p-channel MIS transistor is also implementable. As for a p-channel MIS transistor, antimony ions are preferably implanted as dopant ions for the pocket dopant diffused layer 106.

What is claimed is:

1. A method for fabricating a semiconductor device comprising:
    a first step of forming a gate electrode over a semiconductor region with a gate insulating film interposed therebetween;
    a second step of implanting heavy ions into the semiconductor region on both sides of the gate electrode using the gate electrode as a mask, thereby forming a first ion implanted layer of a second conductivity, at least upper part of which is an amorphous layer;
    a third step of implanting ions of a first dopant into the semiconductor region, in which the amorphous layer has been formed, using the gate electrode as a mask, thereby forming a second ion implanted layer of a first conductivity type;
    a fourth step of conducting a first annealing process to activate the first and second ion implanted layers, thereby forming an extended high-concentration dopant diffused layer of the first conductivity type through diffusion of the first dopant and a pocket dopant diffused layer of the second conductivity type, which is in contact with a bottom portion of the extended high-concentration dopant diffused layer, through diffusion of the heavy ions, respectively;

implanting ions into a surface part of the semiconductor region, thereby forming a fourth ion implanted layer of a second conductivity type before the first step is performed; and conducting a third annealing process to activate the fourth ion implanted layer, thereby forming a dopant diffused layer to be a shallow channel region, wherein in the second step, a dislocation loop layer is formed in the lower region of the amorphous layer in the semiconductor region due to the heavy ions implantation, in the fourth step, the pocket dopant diffused layer is formed having a peak dopant concentration produced by trapping heavy ions in the dislocation loop layer, the pocket dopant diffused layer and the extended high-concentration dopant diffused layer are in contact at the peak dopant concentration of the pocket dopant diffused layer, and a side of the extended high-concentration dopant diffused layer, located below the gate electrode, is not covered by the pocket dopant diffused layer, the heavy ions are indium ions, and an implant dose of the indium ions in the second step is about $1 \times 10^{14}$ to $1 \times 10^{16}/cm^2$.

2. A method for fabricating a semiconductor device according to claim 1, wherein the part of the pocket dopant diffused layer in which the heavy ions are trapped overlaps with a dopant profile of the extended high-concentration dopant diffused layer.

3. A method for fabricating a semiconductor device according to claim 1, further comprising the steps of:

forming a sidewall spacer on side faces of the gate electrode after the third step has been performed;

implanting ions of a second dopant into the semiconductor region using the gate electrode and the sidewall spacer as a mask, thereby forming a third ion implanted layer of the first conductivity type; and conducting a second annealing process to activate the third ion implanted layer, thereby forming a high-concentration dopant diffused layer of the first conductivity type, which is located outside of the extended high-concentration dopant diffused layer, has a junction deeper than that of the extended high-concentration dopant diffused layer and has been formed through diffusion of a second dopant.

4. A method for fabricating a semiconductor device according to claim 3, wherein the heavy ions are implanted at such an implant energy as forming an amorphous/crystalline interface, through implantation of the heavy ions, at a level equal to or deeper than a range of the first dopant and shallower than a range of the second dopant.

5. A method for fabricating a semiconductor device according to claim 3, wherein the first dopant and the second dopant are arsenic.

6. A method for fabricating a semiconductor device according to claim 1, wherein the heavy ions are implanted at such an implant energy as making a range of the heavy ions equal to or deeper than a range of the first dopant and between one to three times as deep as the range of the first dopant.

7. A method for fabricating a semiconductor device according to claim 1, wherein the first annealing process is a rapid thermal annealing process in which the semiconductor region is heated up to a temperature between 950° C. and 1050° C. at a rate between 100° per second and 150° per second and then kept at the temperature for a period of time between 1 second and 10 seconds.

8. A method for fabricating a semiconductor device according to claim 1, wherein the first dopant is arsenic.

9. A method for fabricating a semiconductor device according to claim 1, wherein the fourth ion implanted layer is formed into the surface part of the semiconductor region by implanting indium ions.

* * * * *